United States Patent [19]

Young et al.

[11] Patent Number: 4,939,391

[45] Date of Patent: Jul. 3, 1990

[54] PROGRAMMABLE LOGIC DEVICE WITH OBSERVABILITY AND PRELOAD CIRCUITRY FOR BURIED STATE REGISTERS

[75] Inventors: Michele Young, San Francisco; Kapil Shankar, San Jose, both of Calif.

[73] Assignee: Advanced Micro Devices, Inc., Sunnyvale, Calif.

[21] Appl. No.: 217,942

[22] Filed: Jul. 12, 1988

Related U.S. Application Data

[62] Division of Ser. No. 868,970, May 30, 1986, Pat. No. 4,758,747.

[51] Int. Cl.[5] .................................... H03K 17/60
[52] U.S. Cl. ................................ 307/465; 307/443; 307/454; 307/466
[58] Field of Search ............... 307/443, 454, 456–458, 307/465–466

[56] References Cited

U.S. PATENT DOCUMENTS

| | | | |
|---|---|---|---|
| 3,522,444 | 8/1970 | Lourie | 307/299.2 X |
| 3,962,589 | 6/1976 | Priel et al. | 307/456 |
| 4,400,635 | 8/1983 | Mazgy | 307/457 X |
| 4,471,239 | 9/1984 | Ohba | 307/456 |
| 4,689,502 | 8/1987 | Shimauchi et al. | 307/456 X |
| 4,703,202 | 10/1987 | Enomoto et al. | 307/456 X |

Primary Examiner—David Hudspeth
Attorney, Agent, or Firm—Fliesler, Dubb, Meyer & Lovejoy

[57] ABSTRACT

A programmable array logic device including a programmable logic array, at least one register pair, a multiplexer coupled to the register pair so that they can share a common I/O pin, and an observability buffer for controlling the multiplexer. A dual clock buffer is provided so that registers within the register pair can be clocked singly when in a preload mode or together when in a logic or verification mode. When in the logic mode, either the output of a buried state register or a output register is observed at the I/O pin under the control of a product term generated by the logic array. When in the preload mode the register to be preloaded is selected by an externally provided preload select signal. In the verification mode, which typically follows a programming mode, individually selected product terms within the logic array can be observed by clocking them into the register pairs.

11 Claims, 5 Drawing Sheets

OBSERVABILITY CIRCUITRY TRUTH TABLE

| LOGIC MODE | INPUTS | | | | | | SIGNALS | | | | | | | | | | | | | | | |
|---|---|---|---|---|---|---|---|---|---|---|---|---|---|---|---|---|---|---|---|---|---|---|
| | I..I/O | H | P2 | P1 | PII | P5 | A | B | C | D | E | F | G | H | I | J | K | L | M | N | O | P |
| | ARRAY INPUT SIGNALS | OBS PT | PIN 2 | PIN 1 | PIN 11 | PIN 5 | PRE-LOAD | IPRE-EN | OBSD | IOBS PVC RCE | PVCC | I5 | IOBS VER | OBS PT | | I OBS | OBS | | | CPB | CPO | OUTPUT |
| OBSERVE OUTPUT RESERVE DATA | I/O | 0 | I/O | 0 | 0 | 0 | 0 | — | — | — | 0 | — | — | 0 | 0 | — | 0 | 0 | 0 | 0 | 0 | Q |
| | I/O | 0 | I/O | 0 | 0 | 0 | 0 | — | — | — | 0 | — | — | 0 | 0 | — | 0 | 0 | 0 | — | — | Q |
| OBSERVE BURIED STATE REG. DATA | I/O | — | I/O | 0 | 0 | — | 0 | — | — | — | 0 | — | — | — | — | 0 | — | 0 | 0 | 0 | 0 | QB |
| | I/O | — | I/O | 0 | 0 | — | 0 | — | — | — | 0 | — | — | — | — | 0 | — | 0 | 0 | — | — | QB |
| PRELOAD MODE | | | | | | | | | | | | | | | | | | | | | | |
| PRELOAD ALL OUTPUT REGISTERS | I/O | X | Z | 0 | 0 | 0 | — | 0 | 0 | — | 0 | — | 0 | X | 0 | — | 0 | 0 | — | — | — | X |
| | I/O | X | Z | — | — | 0 | — | 0 | 0 | — | 0 | — | 0 | X | 0 | — | 0 | 0 | — | 0 | 0 | PD |
| | I/O | X | Z | 0 | 0 | — | — | 0 | 0 | — | 0 | — | 0 | X | — | — | 0 | 0 | — | — | — | X |
| | I/O | X | Z | — | — | — | — | 0 | 0 | — | 0 | — | 0 | X | — | — | 0 | 0 | — | 0 | 0 | PD |
| PRELOAD BURIED STATE REGISTERS | I/O | X | Z | 0 | 0 | 0 | — | 0 | 0 | 0 | 0 | 0 | — | X | 0 | 0 | 0 | 0 | — | — | — | X |
| | I/O | X | Z | — | — | 0 | — | 0 | 0 | 0 | 0 | 0 | — | X | 0 | 0 | — | — | 0 | 0 | 0 | PD |
| VERIFY MODE | | | | | | | | | | | | | | | | | | | | | | |
| VERIFY BURIED STATE REG. PRODUCT TERMS | I/O | X | I/O | 0 | 0 | 0 | 0 | — | 0 | — | — | — | 0 | X | 0 | 0 | — | 0 | 0 | 0 | — | QB |
| | I/O | X | I/O | — | — | 0 | 0 | — | 0 | — | — | — | 0 | X | 0 | 0 | — | 0 | 0 | — | 0 | QB |
| VERIFY OUTPUT REG. PRODUCT TERMS | I/O | X | I/O | 0 | 0 | — | 0 | — | 0 | — | — | 0 | — | X | 0 | — | 0 | 0 | 0 | — | — | Q |
| | I/O | X | I/O | — | — | — | 0 | — | 0 | — | — | 0 | — | X | 0 | — | 0 | 0 | 0 | — | 0 | Q |

FIG. 2A

| | | |
|---|---|---|
| 1/0 | = | HI OR LO VALUE |
| 1 | = | HI VALUE |
| 0 | = | LO VALUE |
| Z | = | ZHI VALUE |
| X | = | DON'T CARE |
| Q | = | VALUE IN OUTPUT REGISTER |
| QB | = | VALUE IN BURIED REGISTER |
| PD | = | PRELOAD DATA |

PROGRAMMABLE LOGIC DEVICE WITH OBSERVABILITY AND PRELOAD CIRCUITRY FOR BURIED STATE REGISTERS

CROSS REFERENCE TO RELATED, COPENDING APPLICATION(S)

This is a division of Ser. No. 868,970, filed 5/30/86 now U.S. Pat. No. 4,758,747.

A related, copending application of particular interest to the instant application is U.S. Ser. No. 806,158, filed Dec. 6, 1985 on behalf of Om Agrawal et al., entitled PROGRAMMABLE LOGIC DEVICE WITH OBSERVABLE INTERNAL STATES, and assigned to the assignee of the instant application, now abandoned in favor of Continuation Application Ser. No. 307,183, filed Feb. 2, 1989.

BACKGROUND OF THE INVENTION

1. Field of the Invention

This invention relates generally to programmable logic devices, and more particularly to programmable logic devices having buried state registers.

2. Description of the Related Art

Programmable logic devices such as the programmable array logic (PAL) device offer digital designers a flexible and cost effective implementation for complex logic circuits. PAL, the acronym for a Programmable Array Logic device is a registered trademark of Monolithic Memory, Inc. A typical PAL includes a fuse programmable array of AND gates, and a fixed array of OR gates. In some PALs, the outputs of the OR gates are coupled directly to an I/0 pin, and in other PALs the outputs of the OR gates are input into clockable, D-type or S/R-type registers.

PALs having clockable registers are ideal for use as state machines or, as they are sometimes called, sequencers. A state machine includes a number of registers which store the current state of the machine, input combinatorial logic, and output combinatorial logic. Typically, the outputs of the input combinatorial logic determine the next state to be stored within the state registers, and the current state stored in the state registers form a part of the input to the output combinatorial logic. Quite frequently, outputs of the output combinatorial logic are fed back as inputs to the input combinatorial logic.

Complex state machine designs push the limits of prior art PAL devices. For a variety of practical technical and economic reasons, it is desirable to keep the PAL device package as small as possible and to limit the number of pins associated with the package PAL device designers found that one way to shrink package size is to provide several "buried" state registers which can be used to store the current state number, and separate output registers which can output data to an I/0 pin. By not assigning a I/0 pin to the buried state registers the number of pins required to implement the device is reduced.

A problem with the above mentioned prior art PAL design having separate buried state registers and output registers is that it is difficult to observe the contents of the buried state registers. With such designs, the output of a buried state register must be clocked through the output combinatorial logic and an output register before appearing at an I/0 pin. This process can take several cycles, and is thus both inconvenient and time consuming.

Another problem with the above mentioned prior art PAL design is that it is difficult to preload the buried and output registers for debugging purposes. Without a preloading capability, a sequence of inputs to the device would have to be devised to attain a desired state within the PAL, which again is an inconvenient and time consuming process.

SUMMARY OF THE INVENTION

An object of this invention is to provide a PAL circuit which permits the contents of buried state registers to be quickly and easily observed.

Another object of this invention is to provide a PAL circuit for efficiently loading buried registers or output registers.

Briefly, the logic device of the present invention includes a programmable logic array, at least one register pair including a buried register and an output register, a multiplexer coupling the outputs of the buried register and the output register to a common I/0 pin, an observability buffer for controlling the multiplexer, and a dual clock buffer for selectively preloading the buried register or the output register.

The contents of the buried register and the output register can be observed in three operational modes of the device, namely the logic mode, the preload mode, and the verification mode. When in the logic mode, either the output of the buried register or the output register can be multiplexed to the I/0 pin under the control of an observability product term generated by the logic array. More specifically, under normal operating conditions in the logic mode the output register is multiplexed to the I/0 pin, and under debug operating conditions in the logic mode the buried register is multiplexed to the I/0 pin. When in the preload mode, the observability product term is disabled, and data is synchronously input into either the buried register or the output register from the I/0 pin under the control of the dual clock buffer. In the verification mode, the observability product term is once again disabled, the logic array is enabled for product term output, and product terms are clocked into the buried register and the output register for multiplexing to the I/0 pin.

An advantage of the present invention is that a buried register and an output register share a common I/0 pin, which minimizes pin count and package size while permitting the contents of buried registers to be quickly and easily observed.

Another advantage of this invention is that the buried register and the output register can be preloaded from their shared I/0 pin under user control.

Another advantage of this invention is that product terms from the logic array can be observed via the register pair when the device is in its verification mode. Other objects, features and advantages of the present invention will become apparent upon consideration of the following detailed description and the accompanying drawings, in which like reference designations represent like features throughout the figures.

BRIEF DESCRIPTION OF THE DRAWINGS

FIG. 2a is a truth table illustrating the logic signals at various points in the block diagram of FIG. 1;

FIG. 2b is a legend for the truth table of FIG. 2a;

FIG. 5 is a schematic of the observability buffer 20 shown in FIG. 1.

DETAILED DESCRIPTION OF THE INVENTION

Reference is made now in detail to a specific embodiment of the present invention, which illustrates the best mode presently contemplated by the inventor for practicing the invention. Alternative embodiments are also briefly described as applicable.

Figure 1:
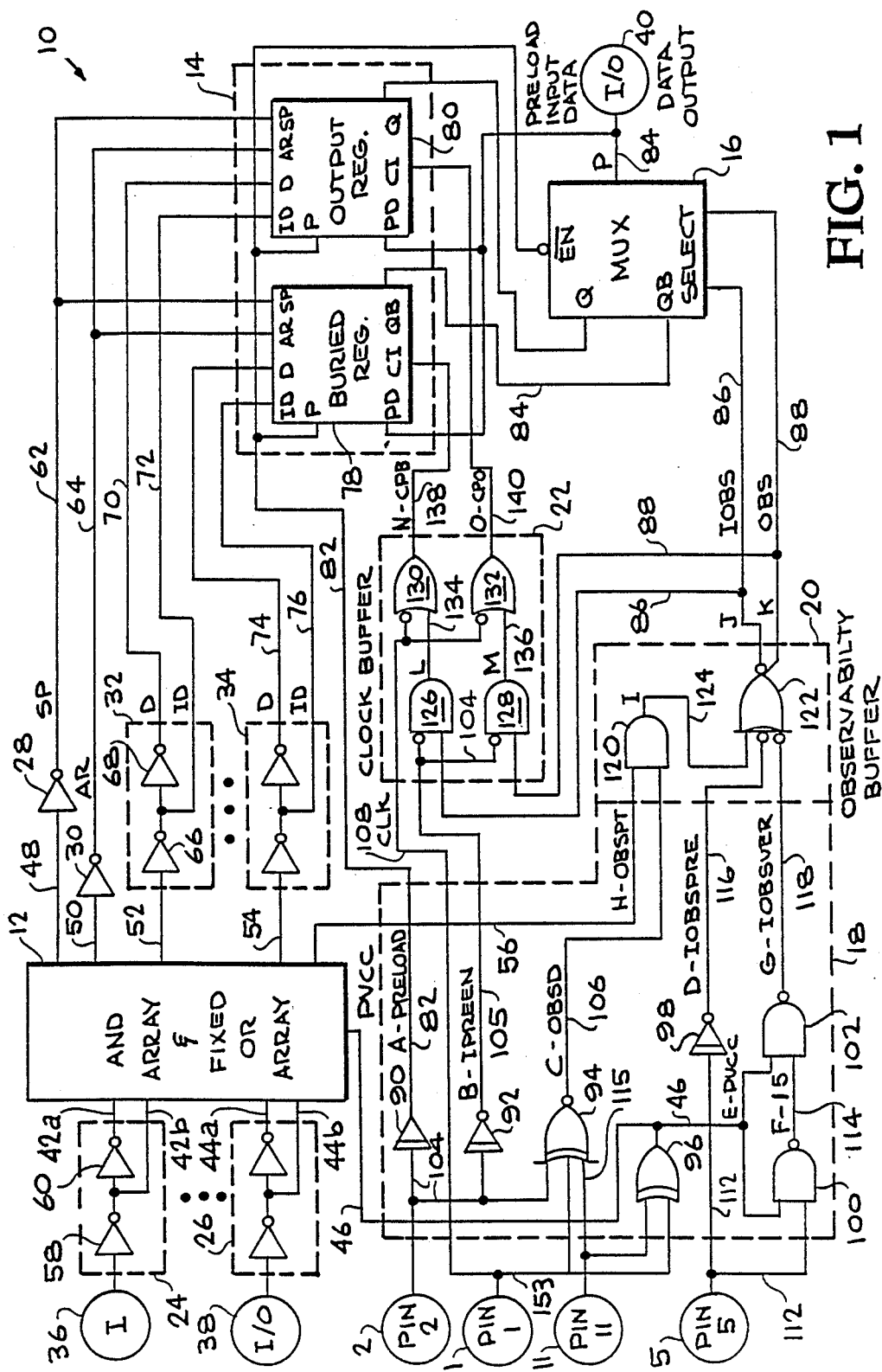
FIG. 1 is a block diagram of a programmable logic device in accordance with the present invention.

Referring to FIG. 1, a programmable array logic (PAL) device 10 includes a programmable logic array 12, a register pair 14, a multiplexer 16, input logic 18, an observability buffer 20, and a dual clock buffer 22. Associated with logic array 12 are a number of input buffers such as buffers 24 and 26, a number of output buffers such as buffers 28 and 30, and a number of data sense amplifiers such as those shown at 32 and 34. External inputs and outputs to logic device 10 include pins 1, 2, 5, and 11 as well as input pin 36 and I/0 pins 38 and 40.

Logic array 12 is preferably a fuse programmable AND array and a fixed OR array having a plurality of array inputs such as inputs 42a/b and 44a/b, a plurality of control inputs such as control input 46, and a plurality of array outputs such as outputs 48, 50, 52, 54, and 56. Alternatively or additionally, logic array 12 can include a fuse programmable OR array. The manufacture and use of a logic array 12 is well known to those skilled in the art, and will not be discussed here in detail. A good reference describing PAL architecture is the *Programmable Array Logic Handbook* published by Advanced Micro Devices, Inc. of Sunnyvale, Calif.

Input buffer 24 couples input pin 36 to array input lines 42a and 42b. More specifically, input pin 36 is coupled to the input of a first inverter 58, the output of which is coupled to array input 42b and to the input of a second inverter 60 which has an output coupled to array input 42a. Thus, a signal applied to pin 36 is developed on input 42a, and its inverse is developed on input 42b. In an analogous manner, a signal applied to pin 38 develops a signal on input 44a, and an inverse signal on input 44b.

Array outputs 48 and 50 are inverted by inverters 28 and 30, respectively, to produce a synchronous preset (SP) signal on a line 62, and an asynchronous reset (AR) signal on a line 64. Data sense amplifier 32 includes a first inverter 66 and a second inverter 68 which produce a data (D) signal on a line 70 and an inverse data signal (ID) on a line 72. Similarly, data sense amplifier 34 produces a data signal (D) on a line 74 and an inverse data signal (ID) on a line 76.

The register pair 14 includes a buried register 78 and an output register 80. Both buried register 78 and output register 80 include a preload enable (P) input, an inverse data input (ID), a data input (D), an asynchronous reset input (AR), a synchronous preset input (SP), a preload data input (PD), and a clock input (CI). Buried register 78 has a data output QB, and output register 80 has a data output Q.

Buried register 78 has its ID and D inputs coupled to lines 76 and 74, respectively, and its AR and SP inputs coupled to lines 64 and 62, respectively. Output register 80 has its ID and D inputs coupled to lines 72 and 70, respectively, and its AR and SP inputs coupled to lines 64 and 62, respectively. The P inputs of buried register 78 and output register 80 are both coupled to a line 82, and their PD inputs are coupled to I/0 pin 40 by a line 84.

Multiplexer 16 has a Q input which is coupled to the Q output of output register 80, and a QB input which is coupled to the QB output of buried registers 78. Multiplexer 16 also has an IOBS select input coupled to a line 86, and an OBS select input coupled to a line 88. The IOBS and OBS select inputs determine which of data inputs Q and QB is multiplexed to line 84 and thus to I/0 in 40.

Input logic 18 includes a zenered buffer 90, a zenered inverter 92, a zenered NOR gate 94, a zenered OR gate 96, a zenered inverter 98, and a pair of NAND gates 100 and 102. Zenered gates 90–98 are tri-level logic devices having input logic levels LO, HI, and ZHI. In TTL implementations of the present device, a LO input is no more than 0.8 volts, a HI input is no less than 2.0 volts, and a ZHI input is nominally 11 volts. While the outputs of zenered gates 90–98 have internal logic levels that are either LO or HI, only ZHI is recognized as a logical high input to the zenered gates. Thus, applying ZHI to the input of zenered buffer 90 produces an internal logic level HI on line 82, and applying a LO or HI to the input of zenered buffer 90 produces an internal logic level LO on line 82. The rest of the gates of logic device 10 are not zenered, and thus are responsive to and generate only LO and HI logic signals.

Pin 2 is coupled to a line 104 which is connected to inputs of zenered buffer 90, zenered inverter 92, and zenered NOR gate 94. Zenered buffer 90 develops a preload enable signal (PRELOAD) on line 82, zenered invertor 92 develops an inverted preload enable signal (IPREEN) on a line 105, and zenered NOR gate 94 develops an observability disable (OBSD) signal on a line 106.

Pin 1 is connected to a line 108 which is coupled to dual clock buffer 22, zenered NOR gate 94, and zenered OR gate 96. Except during the program mode of the present device, pin 1 is used as an external clock input pin, and develops a CLOCK signal on line 108. The CLOCK signal on line 108 can generally be considered to be the master clock for the device 10.

Pin 11 is coupled by a line 110 to an input of zenered NOR gate 94 and to an input of zenered OR gate 96. Zenered OR gate 96 develops a programming and verification (PVCC) signal on line 46 which is input to logic array 12 and to NAND gates 100 and 102.

Pin 5 is coupled to a line 112 which is input into zenered inverter 98 and to NAND gate 100. The output of NAND gate 100 on a line 114 is input to NAND gate 102 as the signal I5. Zenered inverter 98 develops an observe during preload signal (IOBSPRE) on a line 116, and NAND gate 102 develops an observe during verify (IOBSVER) signal on a line 118.

The observability buffer 20 includes an AND gate 120 and an OR gate 122. AND gate 120 is coupled to line 56 of logic array 12 and to line 106 of input logic 18. The output of AND gate 120 is developed on a line 124 which is a non-inverted input to OR gate 122. OR gate 122 has a pair of inverted inputs which are coupled to lines 116 and 118 of input logic 18, and an inverted output on line 86 and a non-inverted output on a line 88. The signal on line 88 is the observation signal (OBS), and the signal on line 86 is the inverse observation signal (IOBS).

Clock buffer 22 includes a pair of AND gates 126 and 128, and a pair of OR gates 130 and 132. Inverted inputs of AND gates 126 and 128 are coupled to line 105, and non-inverted inputs to AND gates 126 and 128 are coupled to lines 86 and 88, respectively. The outputs of AND gates 126 and 128 on lines 134 and 136, respectively, are input to OR gates 130 and 132, respectively. Inverted inputs to OR gates 130 and 132 are coupled to line 108. OR gate 130 develops a buried register clock signal (CPB) on a line 138, and OR gate 132 develops a output register clock signal (CPO) on a line 140. Line 138 is coupled to the clock input of buried register 78, and line 140 is coupled to the clock input of output register 80.

As mentioned previously, logic device 10 operates on three input logic levels, namely LO, HI, and ZHI. The logic device 10 has four modes of operation, namely the logic mode, the preload mode, the verify mode, and the program mode. Of these four modes, the first three are associated with observing the contents of register pair 14, and the program mode is used to program the logic array 12. The four modes of operation will be discussed one at a time, commencing with the observability modes, and finishing with the programming mode.

LOGIC MODE

Figures 2B, 5:
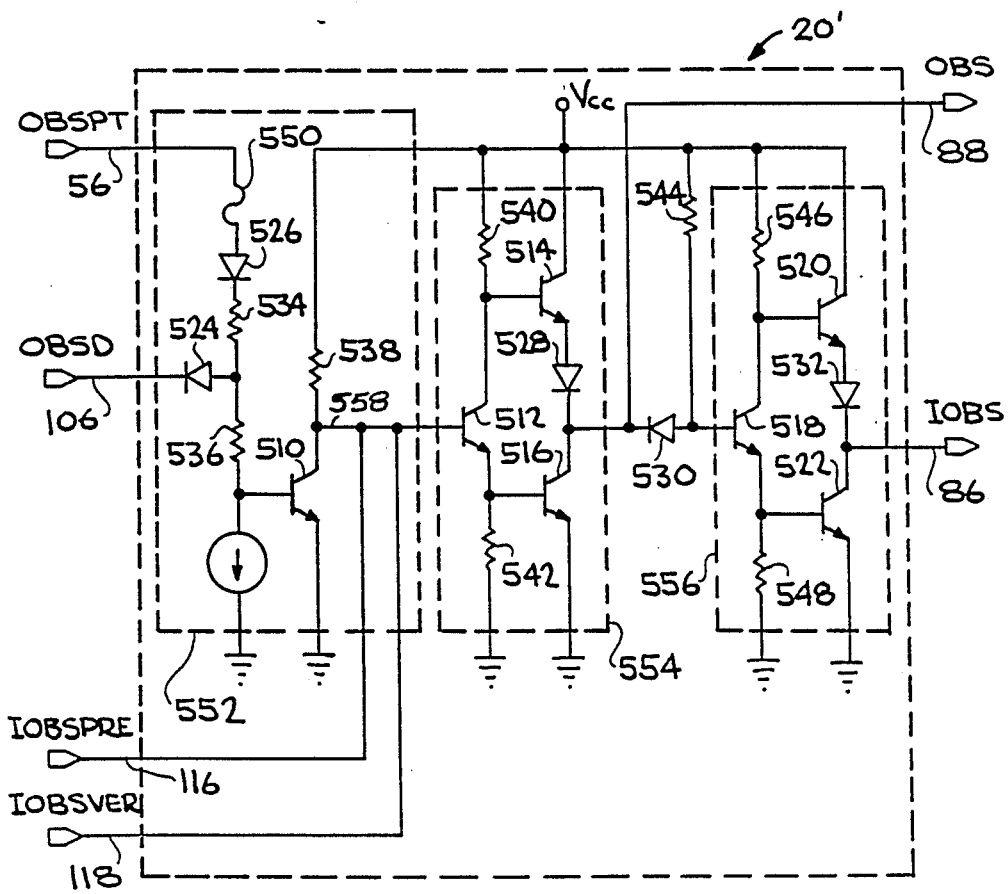

The logic mode of operation of logic device 10 will be discussed with reference to FIGS. 1, 2a, and 2b. FIG. 2a is a truth table for the various input, output, ard internal signals found in logic device 10, and FIG. 2b is the legend for FIG. 2a. The encircled letters A-P in FIG. 1 correspond to the encircled letters A-P of FIG. 2a.

When in the logic mode, data of either output register 80 or of buried state register 78 can be observed under user control by producing an OBSPT signal on line 56. To observe the data of output register 80, the OBSPT signal on line 56 must be LO, and to observe the data of the buried state register 78 the OBSPT on line 56 must be HI. The OBSPT is produced within logic array 12 from the various inputs 36 and 38.

When in the logic mode, none of pins 1, 2, 5, or 11 are zenered. Thus, the PRELOAD signal on line 82 is LO, the IPREEN signal on line 105 is HI, the OBSD signal on line 106 is HI, the IOBSPRE signal D on line 116 is HI, and the IOBSVER signal on line 118 is HI. Since the PRELOAD enable inputs of buried register 78 and output register 80 are not enabled by the PRELOAD signal, register pair 14 operate as standard Set/Reset (SR) or D-type registers.

Since the IPREEN signal on line 105 is HI, the output signals at L and M of AND gates 126 and 128, respectively, are LO. Therefore, the CLOCK signal on line 108 is inverted by OR gates 130 and 132 and are output on lines 138 and 140, respectively, as clock signals CPB and CPO. It should be noted that when in the logic mode, clock signals CPB and CPO are synchronized, and are essentially an inverted image of the CLOCK signal. Therefore, buried registers 78 and output register 80 are clocked together during the logic mode, and the device 10 operates as if it only had a single clock.

Every clock cycle the buried register 78 and the output register 80 clock in data from the outputs of data sense amplifier 34 and 32, respectively. The data being clocked into registers 78 and 80 will, after a short internal delay, show up at outputs QB and Q, respectively.

Multiplexer 16 couples either the Q output of output register 80 or the QB output of buried register 78 to line 84 under the control of the IOBS and the OBS signals on lines 86 and 88, respectively. Since the OBSD signal on line 106, the IOBSPRE signal on line 116, and the IOBSVER signal on line 118 are all HI, the OBS signal on line 88 is essentially the same as the OBSPT signal on line 56. When OBS on line 88 is HI and IOBS on line 86 is LO, QB is multiplexed to line 84, and in the inverse case Q is multiplexed to line 84. Thus, when in the logic mode, a logical HI signal on line 56 allows the observation of the contents of buried register 78, while a logical LO signal on line 56 allows the observation of output register 80.

PRELOAD MODE

Still referring to FIGS. 1, 2a, and 2b to preload the buried register 78 and output register 80 the pin 2 is raised to a ZHI logic level, which causes the PRELOAD signal on line 82 to go HI, the IPREEN signal on line 105 to go LO. and the OBSD signal on line 106 to go LO. The HI on line 82 enables the preload inputs of buried register 78 and output register 80. The HI on line 82 furthermore disables multiplexer 16, causing its output on line 84 to be tri-stated via an inverted enable input EN. The LO logic level IPREEN signal on line 105 enables AND gates 126 and 128, and the LO logic level OBSD signal on line 106 disables AND gate 120, causing the signal level on line 124 to go LO.

If the input signal on pin 5 is LO or HI, the signal IOBSPRE on line 116 will be HI, as will be the IOBSVER signal on line 118. Since the signal level on line 124 is LO, and the signals on lines 116 and 118 are HI, the OBS signal on line 88 will be LO, and the IOBS signal on line 86 will be HI.

Furthermore, since line 86 and 88 are also inputs to the clock buffer 22, a HI signal for IOBS and a LO signal for OBS enables AND gate 126 and disables AND gate 128. Since the IPREEN signal on line 105 is LO, the output of AND gate 126 is HI and the output of AND gate 128 on line 136 is LO. Thus, the CPB signal on line 138 must always be HI, while the signal CPO on line 140 will be the inverse of the CLOCK signal on line 108. In consequence, only output register 80 will be clocked when pin 2 is at a ZHI level and pin 5 is at a LO or HI level, and only output register 80 will be preloaded via a line 84.

If pin 5 is raised to ZHI while pin 2 is still at a ZHI level, IOBSPRE on line 116 is forced LO which, in turn, forces OBS on line 88 HI and IOBS on line 86 LO. As mentioned previously, multiplexer 16 is disabled and its output on line 84 is tri-stated during the preload cycle. Furthermore, the OBS and IOBS signals on lines 88 and 86, respectively, disable AND gate 126 and enable AND gate 128. Thus, when OBS is HI and IOBS is LO, CPO on line 140 is HI while CPB on line 138 is essentially an inversion of the clock signal on line 108. In consequence, only buried register 78 is clocked and thus only buried register 78 preloads data from line 84.

It is important to note that clock buffer 22 operates differently in the preload mode than it did in the logic mode. As mentioned previously, in the logic mode CPB and CPO were essentially the same clock signals. However, in the preload mode only one of the clock signals CPB and CPO is activated at a time under the control of the input signal applied to pin 5.

Figure 3:
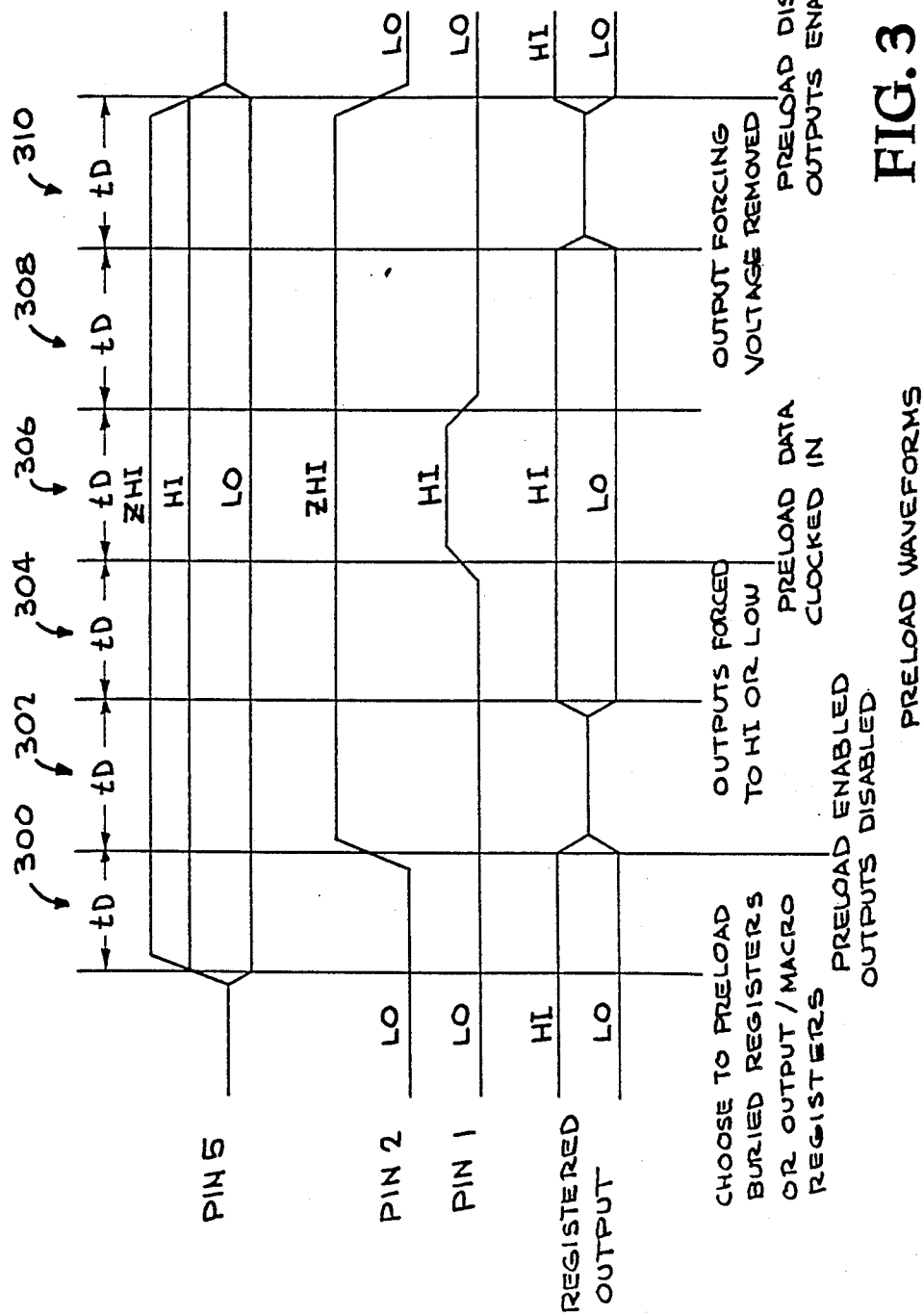
FIG. 3 is a timing diagram of various signals used during the preload mode.

The preload waveforms will be discussed with reference to FIG. 3. Time delays or periods are indicated by tD, and are not necessarily to scale. During a first period 300, pin 5 is raised to ZHI if the buried state registers are to be preloaded, and is HI or LO if the output registers are to be loaded. During period 302, pin 2 is raised to ZHI to preload enable the buried register 78 and the output register 80. After a time delay in period 304, the preload data is clocked into the selected register during a period 306. After time delay periods 308 and 310 the ZHI logic level on pin 2 is removed and the preload cycle is completed.

VERIFICATION MODE

The verification mode can be used to verify product terms stored within logic array 12. Since all of the product terms are associated either with a buried register 78 or an output register 80, it is necessary to clock the desired product term into a register and then observe the contents of that register.

To enter the verification mode, pin 11 is forced to a ZHI level which, in turn, forces OBSD on line 106 to a LO, and PVCC on line 46 to a HI. The HI logic level PVCC signal on line 46 is input to logic array 12 to enable appropriate gates within the logic array so that individually selected product terms are developed on the array outputs 52 and 54. The HI logic level PVCC signal is also input into NAND gates 100 and 102. As before, the LO logic level OBSD signal on line 106 forces AND gate 120 to output a LO logic level signal on line 124.

Pin 5 is used to select either the output QB of buried register 78 or the output Q of register 80 for observation. When pin 5 is LO, signal I5 on line 114 is HI and signal IOBSVER on line 118 is LO. This, in turn, forces OBS on line 88 to go HI and IOBS on line 86 to go LO. Since IPREEN on line 105 is HI, CPB on line 138 and CPO on line 140 are essentially inversions of the CLOCK signal on line 108. Thus, individually selected product terms from logic array 12 are being loaded into buried register 78 and output register 80 on a CLOCK pulse. With OBS on line 88 HI, multiplexer 16 selects input QB for output on line 84.

When pin 5 is HI, signal I5 on line 114 is forced L0 and IOBSVER on line 118 is forced HI. Since the signal on line 124 is LO, IOBSPRE on line 116 is HI, and IOBSVER on line 118 is HI, the OR gate 122 forces the OBS signal on line 88 to a LO level and IOBS on line 86 to a HI level. Again, individually selected product terms from logic array are clocked into buried register 78 and output register 80 on a CLOCK pulse. However, multiplexer 16 is caused to select input Q for output on line 84 when pin 5 is forced HI.

Figure 4:
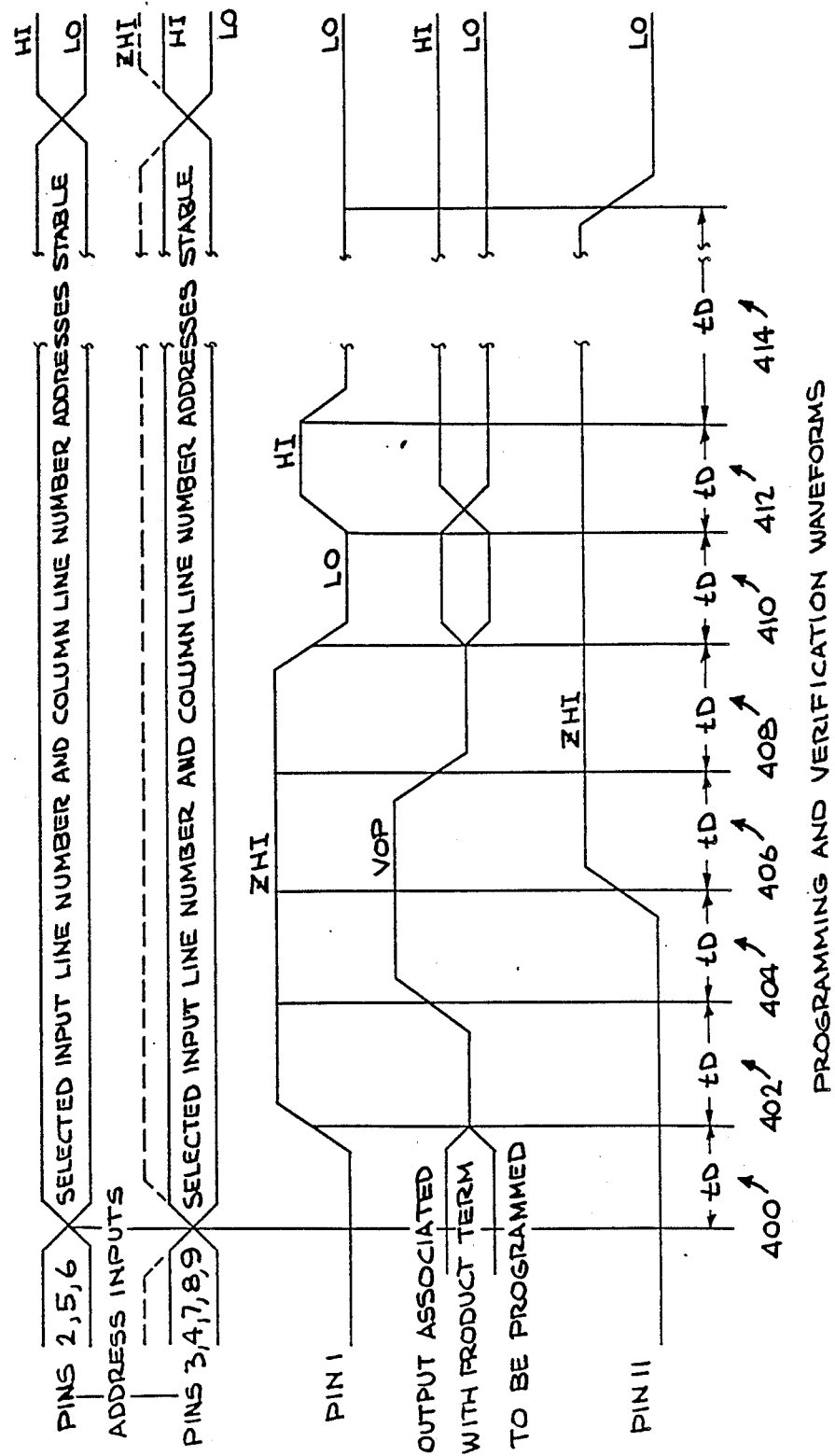
FIG. 4 is a timing diagram of the various signals during the programming mode and verification mode.

Referring now to FIG. 4, the verification waveforms will be discussed. As before, tD represents a time delay or period, and is not necessarily to scale in the drawings. Starting in period 410, pin 11 is at the ZHI level to force device 10 into its verification mode. After a time delay in period 410, a CLOCK signal is applied to pin 1 to permit individually selected product terms from logic array 12 to be clocked into buried register 78 and output register 80. The data output at pin 40 is stable after the end of period 412.

PROGRAMMING MODE

Referring now to FIGS. 1 and 4, to enter the programming mode the CLOCK signal, if present, is removed from pin 1 and a ZHI signal is applied to pin 1. The ZHI level signal on line 108 forces OBSD on line 106 to go LO, causing signal on line 124 to also go LO and the PVCC signal on line 46 to go HI. Control logic within logic array 12 is activated by the HI level PVCC signal on line 46 to permit individually selected product terms within logic array 12 to be programmed.

Referring more particularly to the waveforms of FIG. 4, after a settling period 400, pin 1 is raised to ZHI during period 402. Column addresses are applied to various input pins, and a programming voltage VOP is applied to the device 10 during a period 404. During period 406, pin 11 is raised to ZHI to blow the appropriate fuse of the individually selected product term. In the present implementation of device 10, a blown fuse is a logical LO as verified on an appropriate output pin.

With reference to FIG. 5, an observability buffer 20' includes a number of bipolar NPN transistors 510, 512, 514, 516, 518, 520, and 522; a number of diodes (rectifiers) 524, 526, 528, 530, and 532; and a number of resistors 534, 536, 538, 540, 542, 544, 546, and 548. A fuse 550 is provided to balance a fuse within logic array 12 (not shown).

When in the logic mode, OBSD, IOBSPRE, and IOBSVER are all HI, and the OBSPT signal on line 56 controls the outputs of observability buffer 20'. When OBSPT is LO, the base of transistor 510 will be LO, causing the transistor to turn off. This will force the base of transistor 512 HI, causing it to conduct and thereby turning off transistor 514 and turning on transistor 516. This, in turn, causes the OBS signal on line 88 to go LO, turns off transistor 518, turns on transistor 520, and turns off transistor 522 to raise the IOBS signal on line 86 to HI.

When in the logic mode and when OBSPT is HI, transistor 510 is turned on, forcing the base of transistor 512 to a LO signal level. This causes transistor 512 to turn off, transistor 514 to turn on, and transistor 516 to turn off, causing the OBS signal on line 88 to go HI. The base of transistor 518 is coupled to line 88 by diode 530 and will therefore also be at a HI logic level, turning on transistor 518 and 522, with the result that the IOBS signal on line 86 will go LO.

In the preload mode, the OBSD signal on line 106 is LO, which pulls the base of transistor 510 down to a LO logic level, shutting it off. In consequence, the OBSPT signal on line 56 is disabled. Since, in the preload mode, the IOBSVER signal on line 118 is always HI, the IOBSPRE signal on 116 will control the outputs of observability buffer 20'. When the IOBSPRE signal on line 116 is HI, transistor 512 is turned on, shutting off transistor 514 and turning on transistor 516. The OBS signal on line 88 will therefore be LO when the IOBSPRE signal 116 is HI. The IOBS signal on line 86 will be the inversion of the OBS signal on line 88 (i.e. HI) because transistors 518 and 522 will be off, and transistor 520 will be on. When the IOBSPRE signal on line 116 is LO, the base of transistor 512 is pulled LO, shutting off transistor 512. This, in turn, turns on transistor 514 and turns off transistor 516, causing the OBS signal on line 88 to go HI and the IOBS signal on line 86 to go LO.

In the verify mode, the OBSD signal on line 106 is lo which ensures that transistor 510 is off and that the CBSPT signal on line 56 is disabled. Since the IOBSPRE signal on line 116 is always HI, the IOBSVER signal on line 118 controls the outputs of the observability buffer 20'. The IOBSVER signal on line 118 controls the observability buffer 20' during the verify mode in the same manner that the IOBSPRE signal on line 116 controls the observability buffer 20' during the preload mode.

The observability buffer 20' can be thought of as being comprised of three stages, namely an input stage 552, a first inversion stage 554, and a second inversion stage 556. The input stage 552 is responsive to a first input signal OBSPT, a second input signal OBSD, a third input signal IOBSPRE, and a fourth input signal IOBSVER, and is operative to develop an intermediate signal on a line 558. In effect, transistor 510 and diodes 524 and 526 cooperate to perform the logical NAND operation on the OBSPT and OBSD signals, and line 558 serves as a hard-wired AND for the signal on the collector of transistor 510 and for the IOBSPRE and IOBSVER signals. The first inversion stage 554 and the second inversion stage 556 are substantially identical, and are coupled together by diode 530.

It should be noted that the logic gates of observability buffer 20 of FIG. 1 are slightly different than the logic embodied in the three stages of observability buffer 20' of FIG. 5. This serves as an example that there are many possible logic gate combinations for the observability buffer which can produce the results shown in the truth table of FIG. 2a.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in many fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. An observability buffer comprising:
   an input stage responsive to a first input signal, a second input signal, a third input signal, and a fourth input signal and operative to develop an intermediate signal;
   a first inversion stage coupled to said input stage, said first inversion stage being responsive to said intermediate signal and operative to develop an output signal; and
   a second inversion stage coupled to said first inversion stage, and second inversion stage being responsive to said output signal and operative to develop an inverted output signal,
   wherein said input stage includes transistor means having a base, and wherein said first input signal and said second input signal are both coupled to said base of said transistor means.

2. An observability buffer comprising:
   an input stage responsive to a first input signal, a second input signal, a third input signal, and a fourth input signal and operative to develop an intermediate signal;
   a first inversion stage coupled to said input stage, said first inversion stage being responsible to said intermediate signal and operative to develop an output signal; and
   a second inversion stage coupled to said first inversion stage, said second inversion stage being responsive to said output signal and operative to develop an inverted output signal,
   wherein said input stage includes transistor means having a control gate, and wherein said first input signal and said second input signal are both coupled to said control gate of said transistor means,
   and wherein said first input signal is coupled to said control gate through a forward biased rectifier, and wherein said second input signal is coupled to said control gate through a reverse biased rectifier.

3. An observability buffer as recited in claim 2 wherein said transistor means includes an NPN transistor having an emitter, a base, and a collector, where said base comprises said control gate, where said emitter is coupled to a lower potential than said collector, where said third input signal and said fourth input signal are coupled to said collector, and where said intermediate signal is derived from said collector.

4. An observability buffer comprising:
   an input stage responsive to a first input signal, a second input signal, a third input signal, and a fourth input signal and operative to develop an intermediate signal,
   a first inversion stage coupled to said input stage, said first inversion stage being responsive to said intermediate signal and operative to develop an output signal; and
   a second inversion stage coupled to said first inversion stage, said second inversion stage being responsive to said output signal and operative to develop an inverted output signal,
   wherein said second inversion stage includes transistor means having a control gate coupled to said output signal by a rectifier,
   wherein said transistor means includes a first NPN transistor having an emitter, a base, and a collector, where said base comprises said control gate, and where said emitter is coupled to a lower potential than said collector,
   wherein said second inversion stage further includes a second NPN transistor having an emitter, a base, and a collector, where said base of said second NPN transistor is coupled to said collector of said first NPN transistor said second inversion stage further including a third NPN transistor having an emitter, a base, and a collector, where said base of said third NPN transistor is coupled to said emitter of said first NPN transistor,
   wherein said collector of said second NPN transistor is coupled to a higher potential that said emitter of said third NPN transistor,
   wherein said emitter of said second NPN transistor is coupled to said collector of said third NPN transistor by a forward biased rectifier, and
   wherein said inverted output signal is derived from said collector of said third NPN transistor.

5. A circuit for producing an observability signal (88), for use with first (56), second (106), third (116) and fourth (118) input signals, each of said signals having an active and an inactive state, comprising:
   first means, coupled to receive said first and second signals, for activating said observability signal if and only if said first and second signals are active;

second means, coupled to receive said third signal, for forcing said observability signal active if and only if said third signal is inactive, independently of said first and second signals; and third means for forcing said observability signal active if and only if said fourth signal is inactive, independently of said first and second signals.

6. A circuit according to claim 5, wherein said first means comprises:

a first inverting amplifier (510) having a control input and an output (558);

a second inverting amplifier (554) having an input coupled to said output of said first inverting amplifier and further having an output (88) carrying said observability signal; and activation means for activating said control input of said first inverting amplifier if and only if said first and second signals are active, and wherein said second means comprises forcing means (116), coupled to receive said third signal, for forcing said output of said first inverting amplifier inactive if and only if said third signal is inactive, independently of the state of said control input of said first inverting amplifier.

7. A circuit according to claim 6, further comprising a third inverting amplifier (556) having a control input and an output, said control input of said third inverting amplifier being coupled to receive said observability signal.

8. A circuit according to claim 5, for use further with additional input signals (46, 112), further comprising circuitry (98, 100, 102) having inputs and first and second outputs, said inputs of said circuitry being coupled to receive said additional input signals, said first output of said circuitry being coupled to provide said third signal and said second output of said circuitry being coupled to provide said fourth signal, said circuitry providing said third and fourth signals such that said third and fourth signals are never both inactive simultaneously.

9. A circuit according to claim 8, further comprising:

first (78) and second (80) registers, each having an output;

a package pin (40); and means (16) coupled to receive said observability signal, for providing to said package pin either said output of said first register or said output of said second register selectably in response to said observability signal.

10. A circuit for producing an observability signal (88), for use with first (56), second (106) and third (116 or 118) input signals, each of said signals having an active and an inactive state, comprising:

a first inverting amplifier (510) having a control input and an output (558);

a first diode (526) having an anode and a cathode, said anode of said first diode being coupled to said first signal and said cathode of said first diode being coupled to said control input of said first inverting amplifier;

a second diode (524) having an anode and a cathode, said anode of said second diode being coupled to said cathode of said first diode and said cathode of said second diode being coupled to said second signal;

a second inverting amplifier (554) having an input coupled to said output of said first inverting amplifier and further having an output (88) carrying said observability signal; and forcing means (116 or 118), coupled to receive said third signal, for forcing said output of said first inverting amplifier inactive if and only if said third signal is inactive, independently of the state of said control input of said first inverting amplifier.

11. A circuit for producing an observability signal (88), for use with a first (56), second (106), third (116) and fourth (118) input signals, each of said signals having a high and a low voltage state, comprising:

an NPN transistor (510) having a base, a collector (558) and an emitter;

a pull-up element (538) coupled between said collector of said first transistor and a voltage higher than said emitter of said first transistor;

a first diode (526) having an anode and a cathode, said anode of said first diode being coupled to said first input signal and said cathode of said first diode being coupled to said base of said first transistor;

a second diode (524) having an anode and a cathode, said anode of said second diode being coupled to said cathode of said first diode, and said cathode of said second diode being coupled to said second input signal;

a first conductor (116) connecting said third input signal to said collector of said first transistor;

a second conductor (118) connecting said fourth input signal to said collector of said first transistor; and an inverting buffer (554) having an input and an output, said input of said inverting buffer being coupled to said collector of said first transistor, and said output of said inverting buffer carrying said observability signal.

* * * * *